US012754529B2

(12) United States Patent
Fontanella et al.

(10) Patent No.: US 12,754,529 B2
(45) **Date of Patent: *Oct. 6, 2026**

(54) DEVICE, SYSTEM, METHOD, AND COMPUTER PRODUCT FOR DETECTING AND EVALUATING ENVIRONMENTAL QUANTITIES AND EVENTS WITH MODULAR APPROACH AND VARIABLE COMPLEXITY

(71) Applicant: STMicroelectronics S.r.l., Agrate Brianza (IT)

(72) Inventors: Luca Fontanella, Cusago (IT); Andrea Labombarda, Milan (IT); Marco Bianco, Cesano Boscone (IT); Davide Ghezzi, Boltiere (IT); Christian Raineri, Ponte Nosta (IT); Paolo Gatti, Rezzato (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 811 days.

This patent is subject to a terminal disclaimer.

(21) Appl. No.: 18/301,002

(22) Filed: Apr. 14, 2023

(65) Prior Publication Data

US 2023/0251621 A1 Aug. 10, 2023

Related U.S. Application Data

(62) Division of application No. 16/734,233, filed on Jan. 3, 2020, now Pat. No. 11,650,566.

(30) Foreign Application Priority Data

Jan. 4, 2019 (IT) ........................ 102019000000082

(51) Int. Cl.
*G05B 19/406* (2006.01)
*G05B 23/02* (2006.01)

(52) U.S. Cl.
CPC ....... *G05B 19/406* (2013.01); *G05B 23/0218* (2013.01); *B81B 2201/02* (2013.01);
(Continued)

(58) Field of Classification Search
CPC .............. G05B 19/406; G05B 23/0218; G05B 2219/34351; B81B 2201/02;
(Continued)

(56) References Cited

U.S. PATENT DOCUMENTS

| | | | | |
|---|---|---|---|---|
| 7,064,671 | B2 * | 6/2006 | Vanderah | G01F 1/42 713/323 |
| 8,160,725 | B2 * | 4/2012 | Allgaier | G06F 1/3203 455/343.1 |
| 8,162,846 | B2 | 4/2012 | Epley | |
| 8,446,378 | B2 * | 5/2013 | Moll-Carrillo | G16H 20/30 345/184 |
| 2007/0239399 | A1 | 10/2007 | Sheynblat et al. | |

(Continued)

FOREIGN PATENT DOCUMENTS

| | | | |
|---|---|---|---|
| CN | 104126184 | A | 10/2014 |
| CN | 107764280 | A | 3/2018 |

(Continued)

*Primary Examiner* — Robert E Fennema
*Assistant Examiner* — Olvin Lopez Alvarez
(74) *Attorney, Agent, or Firm* — Seed IP Law Group LLP

(57) ABSTRACT

A system for detecting and evaluating environmental quantities and events is formed by a detection and evaluation device and a mobile phone, connected through a wireless connection. The device is enclosed in a containment casing housing a support carrying a plurality of inertial sensors and environmental sensors. A processing unit is coupled to the inertial sensors and to the environmental sensors. A wireless connection unit, is coupled to the processing unit and a wired connection port, is coupled to the processing unit. A programming connector is coupled to the processing unit and is configured to couple to an external programming unit (Continued)

to receive programming instructions of the processing unit. A storage structure is coupled to the processing unit and a power-supply unit supplied power in the detection and evaluation device. The mobile phone stores an application, which enables a basic use mode, an expert use mode, and an advanced use mode.

19 Claims, 5 Drawing Sheets

(52) U.S. Cl.
CPC ................. *B81B 2201/0228* (2013.01); *B81B 2201/0264* (2013.01); *B81B 2201/0278* (2013.01); *B81B 2207/01* (2013.01); *G05B 2219/34351* (2013.01)

(58) Field of Classification Search
CPC .... B81B 2201/0228; B81B 2201/0264; B81B 2201/0278; B81B 2207/01; B81B 7/02; G01D 21/00; G01D 21/02
See application file for complete search history.

(56) References Cited

U.S. PATENT DOCUMENTS

2007/0250126 A1* 10/2007 Maile ................. A61N 1/37252 607/16
2010/0331721 A1 12/2010 Epley
2012/0293616 A1* 11/2012 Kwon .................. H04N 13/139 348/E13.02
2014/0358472 A1 12/2014 Goel et al.
2016/0303455 A1* 10/2016 Carswell .............. A61B 5/1124
2017/0011621 A1* 1/2017 Bora ....................... G08C 17/02
2017/0086011 A1* 3/2017 Neves ..................... H04L 67/12
2019/0005434 A1 1/2019 Brower, Jr. et al.
2019/0293772 A1* 9/2019 Pfeiffer ................. G01S 7/4972

FOREIGN PATENT DOCUMENTS

CN 107854122 A 3/2018
CN 107861743 A 3/2018
CN 108197068 A 6/2018
EP 2863328 A1 * 4/2015 ......... G09B 19/0038
KR 20140140891 A * 12/2014 ......... G06F 3/04164
WO WO 2015087164 A1 6/2015

* cited by examiner

DEVICE, SYSTEM, METHOD, AND COMPUTER PRODUCT FOR DETECTING AND EVALUATING ENVIRONMENTAL QUANTITIES AND EVENTS WITH MODULAR APPROACH AND VARIABLE COMPLEXITY

BACKGROUND

Technical Field

The present disclosure relates to a device, a system, a method, and a computer product for detecting and evaluating environmental quantities and events with modular approach and variable complexity.

Description of the Related Art

As is known, various devices for consumer applications are present on the market, based upon environmental sensors, for example of a MEMS type, which enable detection of a plurality of quantities, such as temperature, speed, acceleration, pressure, etc., for performing one or a few simple preset functions, such as step counting, heart rate measurement, time-of-activity counting, atmospheric pressure measurement, etc. These apparatuses and devices are experiencing a major commercial success, since they allow information useful and/or attractive for users to be acquired, without requiring particular technical knowledge and/or long learning times. These apparatuses and devices are, however, dedicated and do not enable use of already available quantities and information to develop functions that are more complex or just different from the envisaged ones.

Moreover, advanced development platforms are available on the market, comprising a plurality of sensors of different types and provided with external-connection structures. These platforms allow detection of a variety of environmental data and their transfer to a processing system, such as a personal computer or a complex processing apparatus, able to further process the received data in a programmable way to carry out complex functions, such as monitoring good movement paths to detect anomalies and faults and/or particular events. In this case, processing of the acquired data for performing complex functions and storing them require the development of suitable programs, using specific programming languages and operations. These systems are thus dedicated to a more restricted circle of users who are acquainted with the specific programming languages and are able to carry out the required operations, in addition to availing the time necessary for development of the programs and being motivated thereto.

Instead, no systems are commercially available that combine the simplicity of use of simpler devices, aimed at the consumer sector, with the more complex platforms, aimed at professional application.

The availability of these systems is, on the other hand, desirable to simplify the development activities for more complex functions and increase the number of persons able to process the environmental data for performing relatively simple but programmable functions, for example exploiting the possibilities provided by IoT (Internet on Things) applications and/or simplifying the operations required of more advanced users.

BRIEF SUMMARY

One aim of embodiments of the present disclosure is to provide a system that fills the gap between devices dedicated to consumer use and complex systems requiring a high knowledge and programming commitment by providing the possibility of creating functions of a complexity correlated to the needs in a flexible way.

According to the present disclosure, embodiments are directed to a device, a system, a method, and a computer product for detecting and evaluating environmental quantities and events are provided.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
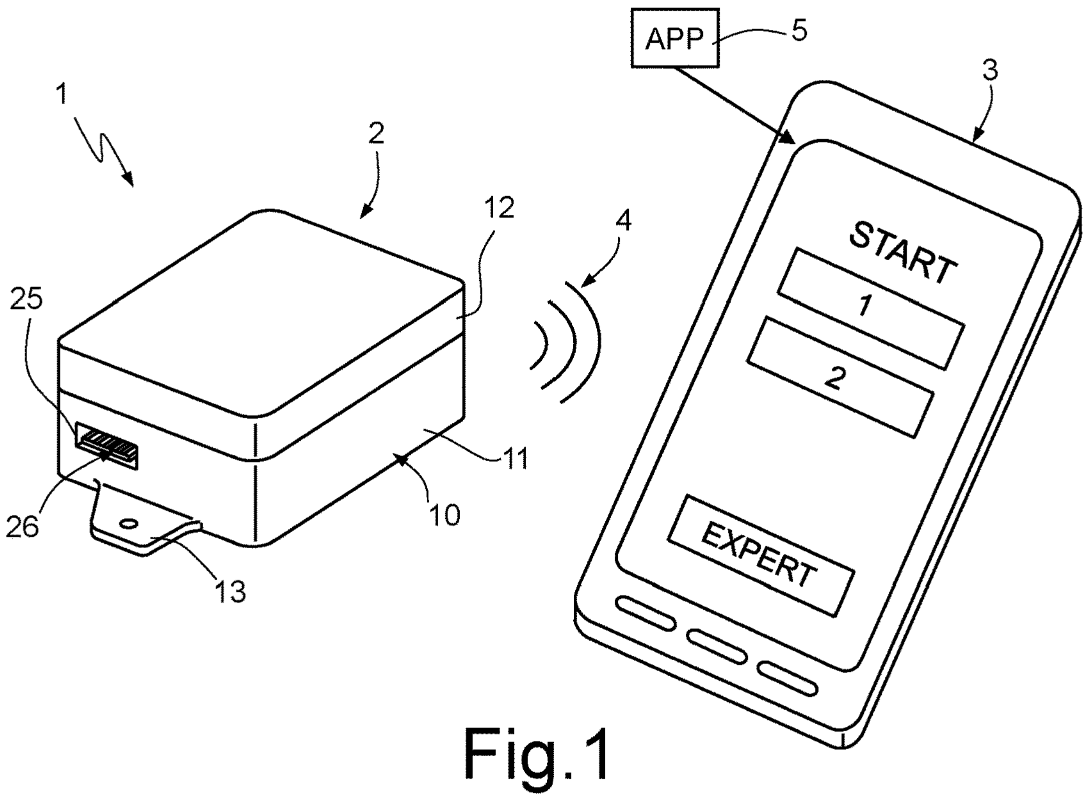
FIG. 1 is a schematic and perspective illustration of components of a present detection system including a device for detecting physical quantities, and a mobile phone according to an embodiment of the present disclosure.

FIG. 1 shows a system for detecting and evaluating environmental quantities and events with modular approach and variable complexity, referred to hereinafter as a detection system 1.

The system 1 includes a multisensor device 2 and a mobile device, in particular a mobile phone 3, connected together through a wireless connection 4 (represented schematically and which may be, for example, a Bluetooth connection), intended to provide a desired connectivity, without having an excessive impact upon consumption of the multisensor device 2.

The multisensor 2 includes a casing 10 having a generally parallelepipedal shape with rounded edges. The casing 10 is formed by a first and a second half-shells 11, 12, fixed together, for example screwed, as illustrated more clearly in FIG. 2. One of the two half-shells (here the first half-shell 11) may be provided with connection flanges 13 (see also FIG. 2) for enabling fixing on walls or apparatuses.

Figure 2:
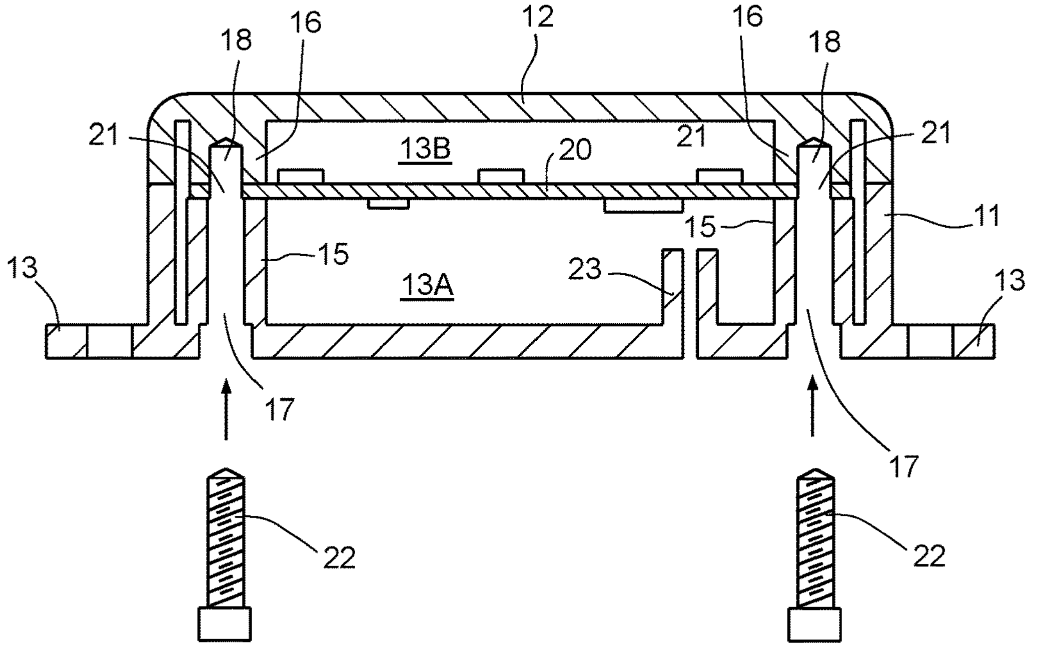
FIG. 2 is a cross-section of a detection device of the detection system of FIG. 1.

In detail, FIG. 2, each half-shell 11, 12 of the casing 10 defines a respective first and a second half-chambers 13A, 13B; first projections 15 extending inside the first half-chamber 13A towards the second half-shell 12, and second projections 16 extending inside the second half-chamber 13B towards the first half-shell 11; the first and the second projections 15, 16 facing each other. The first projections 15 are provided with respective through openings 17, and the second projections 16 are provided with blind holes 18, preferably threaded and aligned to the through openings 17.

The casing 10 houses a support 20, for example, a printed circuit board, blocked between the first and the second half-shells 11, 12 of the casing 10 and precisely between the projections 15, 16 of the latter. To this end, the support 20 is provided with a pair of through holes 21, aligned to the through openings 17 and to the blind holes 18. During assembly, screws 22 are inserted into the through openings 17 and are screwed into the blind holes 18, through the through holes 21, thus blocking the two half-shells 11, 12, as well as the support 20, together. However, other ways of fixing the two half-shells 11, 12 and the support 20 are possible, for example via snap-action retention elements, provided that these allow closing and re-opening of the casing 10.

Moreover, one of the two half-shells, here the first half-shell 11, is provided with a connection opening 23, which connects the external environment with the half-chamber 13A of the casing 10. The half-chamber 13A is thus at the same pressure as the external environment, and a purposely provided pressure sensor (described below) may detect ambient pressure.

One of the two half-shells, here the second half-shell 12, has an opening 25 (FIG. 1) near a wired connector 26 (described below), such as a USB connector.

Figure 3A:
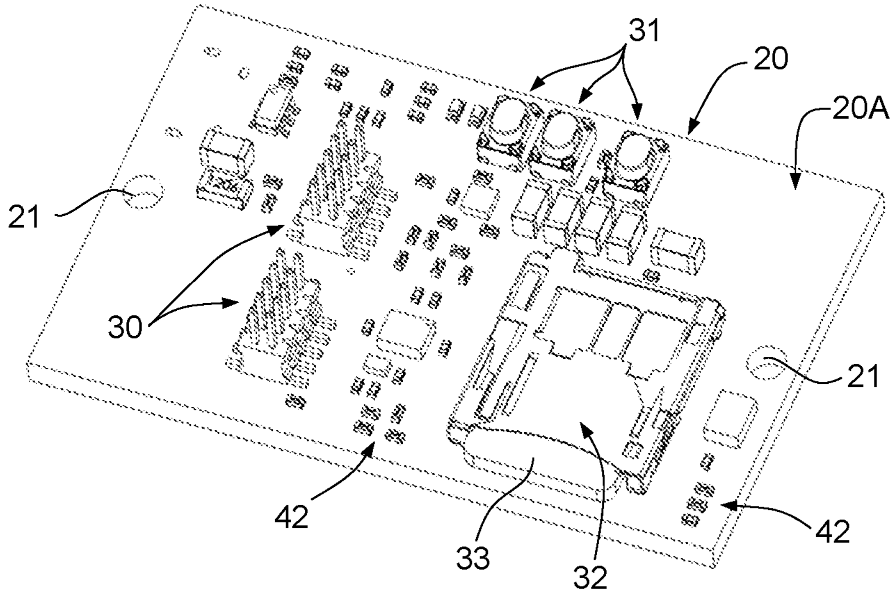
FIGS. 3A and 3B are perspective views, from above and from below, respectively, of a part of the detection device of the detection system of FIG. 1.
Figure 3B:
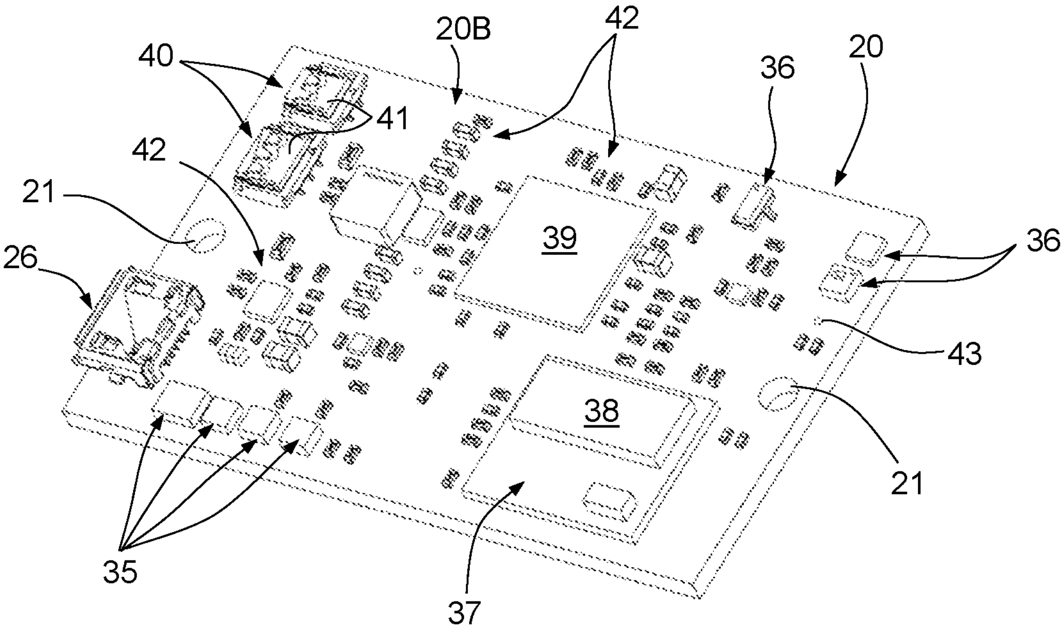

FIGS. 3A and 3B show the support 20, in view from above and from below respectively, which carries electronic components, connectors, and the electrical connection circuit.

In detail, the support 20 has a first and a second faces 20A, 20B, each configured to carry a plurality of components, of a known and commercially available type.

For instance, the first face 20A of the support 20 carries:

- connectors 30, designed to connect to an external programming unit or apparatus (not illustrated) for programming a microcontroller 39, carried by or on the second face 20B, for advanced use of the system 1, as discussed below;
- pushbuttons 31, comprising a reset pushbutton and two on/off pushbuttons, which may be used for advanced use of the system 1 for deactivation/activation of parts of the multisensor device 2, in particular connected to the microcontroller 39, for example, for debugging purposes; and
- a support 32 for a memory 33, for example an SD memory card, for storing data, measurements, and results acquired by the multisensor device 2.

Moreover, the second face 20B of the support 20 carries:

- the USB connector 26, for example of the micro-USB type;
- a plurality of inertial sensors 35, typically MEMS components and including, for example, a gyroscope, an accelerometer, a pressure sensor, and a microphone;
- a plurality of environmental sensors 36, for example including a temperature sensor, a humidity sensor, and a magnetometer;
- a support 37 and a wireless (e.g., Bluetooth) communication circuit or module 38, which may also be referred to as a wireless connection unit herein;
- the microcontroller 39; and
- connectors 40 for one or more supply batteries 41, for example lithium-polymer batteries; the connectors 40 are connected, through conductive paths and lines (not illustrated) to all the electronic components carried by or on the support 20, as well as to the USB connector 26 for enabling charging of the supply batteries 41; and
- electronic components 42.

The support 20, preferably a printed circuit board, as already mentioned, further includes the electrical-connection lines between the various components, for example conductive paths formed on the faces 20A, 20B or within the support 20, in a per se known manner and not illustrated. The support 20 is moreover provided with an acoustic opening 43, for fluidically connecting the two half-chambers 13A and 13B, keeping them at the same pressure and enabling passage of air and sound waves (for proper operation of the inertial sensors and environmental sensors 35, 36, in particular of the pressure sensor, the microphone, and the humidity sensor).

The microcontroller 39 typically includes, in a known way, a processing unit or circuit (not illustrated), and an integrated memory (also not illustrated), for storing data, information, and predefined libraries, aimed at implementation of the desired functions.

With reference again to FIG. 1, the mobile phone 3 is a mobile phone of a smartphone type, enabling loading of applications or "apps" and has Bluetooth connectivity.

The system 1 further includes an application 5, which, once downloaded into the mobile phone 3, guides the user in use of the multisensor device 2.

In detail, the system 1 enables use of the device 2 according to three modes, two of which are guided by the application 5. These modes of use refer to a basic or simple level of use of the device 2 (referred to hereinafter as "basic mode"), an expert level of use ("expert mode"), and an advanced level of use ("pro mode"), as described hereinafter with reference to FIGS. 4-8.

In detail (FIG. 4), the application 5 is active in basic mode and initially presents a menu with some simple functions that have already been pre-loaded, such as baby-crying function, barometer, compass, data logger, event counter, level-meter, noise measurement, vibration monitoring, environmental monitoring, pedometer, and vibration monitoring. Other possible functions that may be envisaged by the application 5 include, for example, vehicle/object tracking.

The pre-loaded functions do not require particular knowledge by the user and generally are started directly with selection of the specific function. To this end, the app 5 sends, via the Bluetooth connection 4, the request for the function selected by the user. This request is supplied to the microcontroller 39 and is a call to a specific predefined library from among the set of compiled libraries contained in the multisensor device 2. Therefore, the microcontroller 39, on the basis of the specific request, activates the sensors 35-36 requested by the function at issue, to collect and, if envisaged, process the corresponding data, in a per se known manner. The collected and possibly processed data may then be transmitted, via the Bluetooth connection 4, to the mobile phone 3 for display.

Figure 5:
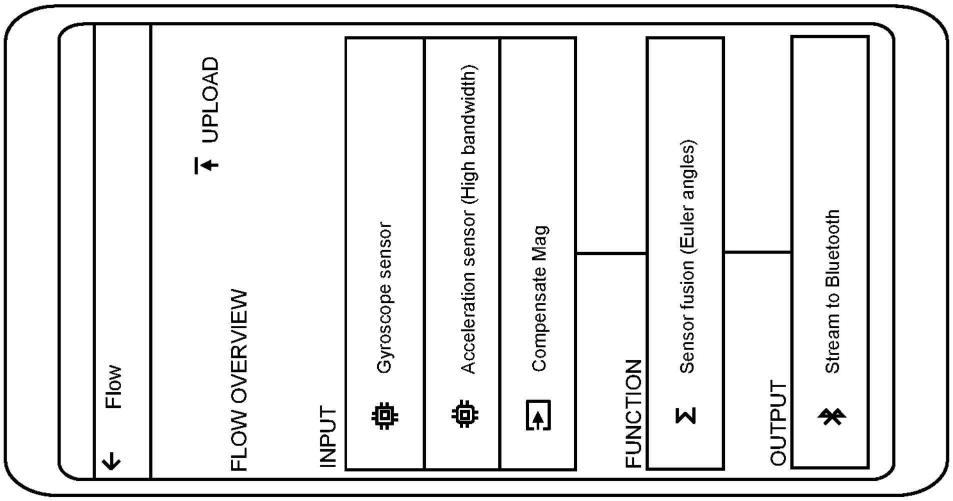
FIGS. 4-8 show schematically some screenshots of an application that may be downloaded into a mobile phone of the detection system of FIG. 1.
Figure 4:
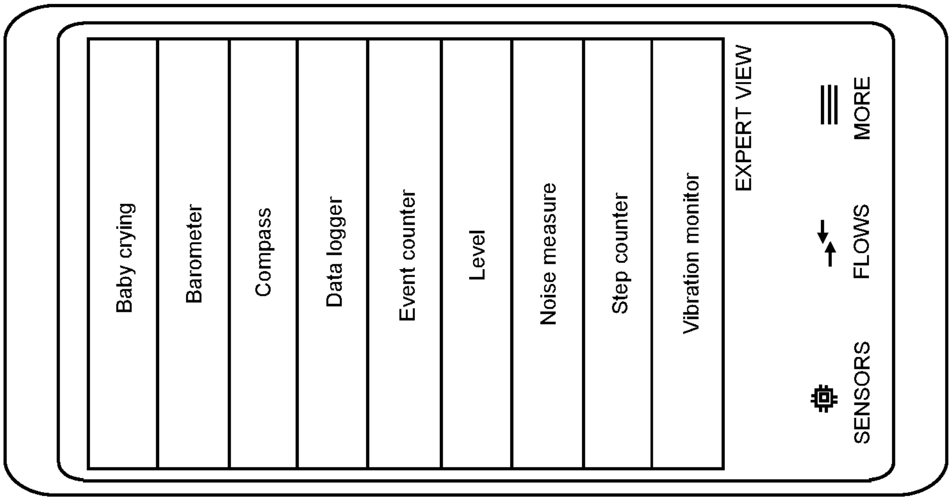
Figure 6:
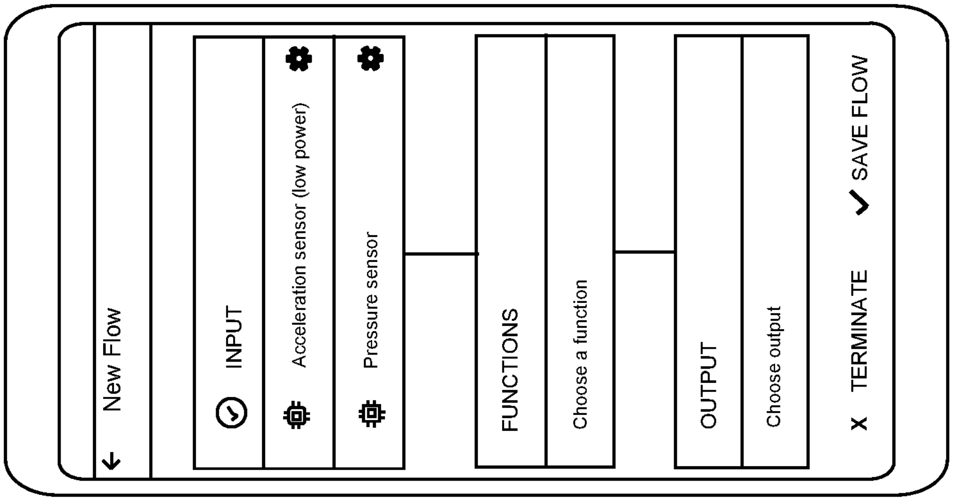
Figure 7:
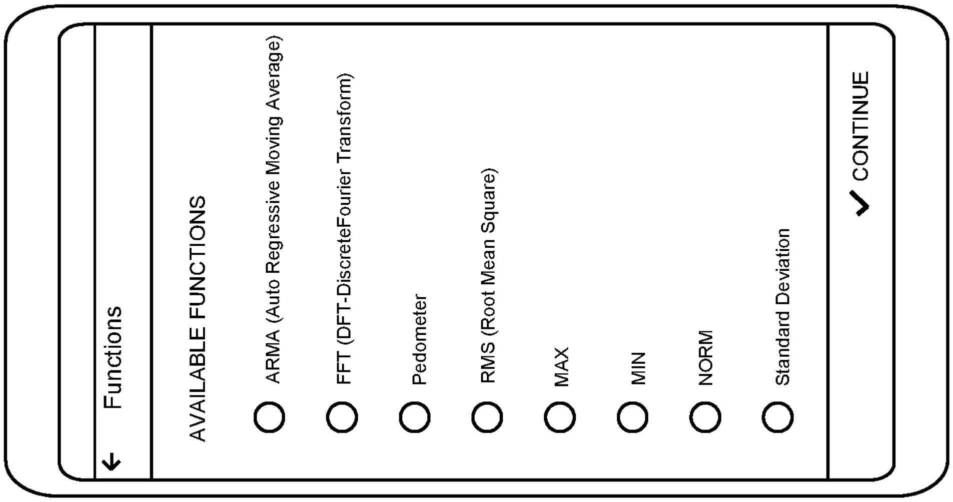
Figure 8:
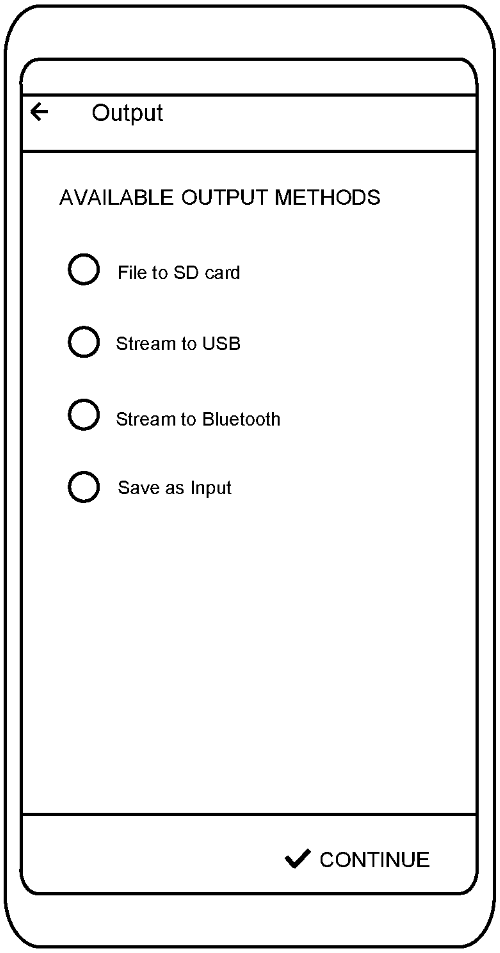

To increase the user awareness and stimulate his curiosity towards a more personal use, the application 5 may provide, once the desired function has been selected, the possibility of displaying on the screen the sensors 35-36 involved in the requested function, as well as the type of performed action. For instance, FIG. 5 shows the screenshots when selecting the compass function, which uses the data supplied by the gyroscope, the accelerometer, and the compensation magnetometer and performs combination and sending of the detected data via Bluetooth.

The last item in the initial menu enables passage to the expert mode. Selection of this mode allows already stored functions to be called, existing functions to be modified, or create new functions to be created using a simple graphic tool. To this end, when creation of a new function is selected, the application 5 asks the user to select the sensors to be used and presents a screenshot representing the various sensors that may be selected (see, for example, FIG. 6). Once the sensors have been selected and the selection has been confirmed, the application asks the user to select a function to be executed and shows a screenshot representing a series of possible functions that may be performed with the selected sensors (see, for example, FIG. 7, in the case of choice of the temperature sensor, the humidity sensor, and the accelerometer). After the function has been selected, the system enables addition of other functions and then asks the user to select the output, presenting the possibilities (saving to a memory card, sending to the USB port, sending via Bluetooth, and saving as input, i.e., as subprogram that may be subsequently used for creating more complex programs, FIG. 8). The application allows saving of the new generated function with any desired name and sending it to the device 5. In this case, the request sent by the mobile phone 3 is received by the microcontroller 39, which activates the sensors selected by the user to collect and possibly process the corresponding data for carrying out the required function.

As indicated, the system 1 moreover enables a use level according to the advanced mode, which is activated by opening the casing 10 of the multisensor device 2 and connecting the latter (through the connectors 30) to an external programming apparatus (not illustrated). This mode assumes the user to be so expert and interested to be able to install the development tools on a personal computer and program the device in a standard programming language, for example C+++. In particular, upon detecting the connection of the connectors 30, the microcontroller 29 goes into a reset condition and deactivates control through the mobile phone 3. Consequently, in this step, even if the application 5 attempts to supply commands to the device 2, these are ignored. In particular, in this step, the multisensor device 2 behaves like a normal evaluation board, which requires programming of the instructions of the desired advanced functions and communicates with the external programming apparatus through the connectors 30. Thereby, at the end of programming, the application 5 may maintain the communication between the multisensor device 2 and the mobile phone 3 and enable the mobile phone 3 to receive the new advanced functions for display and storage. In this case, at subsequent start-up of the system, the application 5 may enable display of the new advanced functions from the pre-loaded basic or expert functions. Moreover, during the advanced-programming process, the application 5 may enable information and data display by the multisensor device 2.

The system described herein has many advantages. In particular, in the basic mode, it does not require the user to invest time and attention in understanding operation of the system but also provides more advanced use modes, leading the user and enabling him to interact according to his own skills, time, and desires. The present system is extremely flexible and enables acquisition of a plurality of data and execution of a plurality of functions in an extremely simple way, for the less expert user, guiding him towards the discovery of new possibilities and creation of his own functions, without requiring writing of programming instructions. However, the system is not limited to a simple use mode, but enables the more enterprising and inquisitive user to generate, right from the start, particular functions which may be executed by the sensors, affording possibilities and stimulating the user's imagination to obtain more complex results, with acquisition of historic data and information, still without requiring the knowledge of programming techniques. Finally, the present system allows a professional use, enabling the advanced user both to exploit already present functions, saving time thereon, and to program more complex functions, according to his own needs, using the same system.

The system finds application in a wide range of situations and may be used in different environments. For instance, the multisensor device 2 may be arranged in the open air, for enabling weather forecasting or monitoring of environmental parameters; may be applied to structures to be monitored, for example for enabling earthquakes detection, measurement of vibrations of objects such as motors or engines, and monitoring of time evolution of various physical quantities or events correlated thereto. Moreover, the device, in expert mode, may be programmed so as to create a mesh with other devices, using Bluetooth communication, and using the mobile phone 3 as interface.

Finally, it is clear that modifications and variations may be made to the device, the system, the method, and the computer product for detection and evaluation, described and illustrated herein, without thereby departing from the scope of the present disclosure, as defined in the attached claims.

For instance, the shape of the casing may be any, and the support 20 may be fixed in position in a different way from what has been illustrated and described.

Furthermore, the mobile device may be of a different type; for example, in addition to a mobile phone, it may be a tablet, a minitablet, a smartwatch, a smart multimedia reader, a smart e-reader, etc.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for detecting and evaluating environmental quantities and events, comprising:

displaying, via a mobile device, a plurality of executable functions and an expert-use function;

detecting, via the mobile device, selection of a specific function from the plurality of executable functions or selection of the expert-use function;

in response to detecting the selection of the specific function, sending, via the mobile device, a request for activation of the specific function through a wireless connection of the mobile device;

receiving, by a detection and evaluation device, a request for executing the specific function;

activating, by a processing circuit, at least one selected sensor selected from at least one inertial sensor or at least one environmental sensor;

receiving, by the processing circuit, measurement data from the at least one selected sensor;

performing, by the processing circuit, the specific function based on the measurement data received from the at least one selected sensor;

sending to the mobile device, by the detection and evaluation device, detection and evaluation data associated with the specific function, using the wireless connection;

receiving, by the mobile device, the detection and evaluation data associated with the specific function;

displaying, by the mobile device, the detection and evaluation data associated with the specific function; and in response to detecting the selection of the expert-use function, activating an expert-use mode, wherein activating the expert-use mode comprises:

displaying, by the mobile device, a list of at least one inertial sensor and at least one environmental sensor available in the detection and evaluation device; and detecting, by the mobile device, selection of at least one of the at least one inertial sensor or at least one environmental sensor in the list;

showing, by the mobile device, a list of expert-use functions including at least one expert-use function executable by the selected sensor or detector; and detecting, by the mobile device, selection of an expert-use function from the list of expert-use functions.

2. The method according to claim 1, wherein activating the at least one environmental sensor is a temperature sensor or a humidity sensor.

3. The method according to claim 1, wherein activating the expert-use mode includes:

permitting a user to add to one or more expert-use functions to the list of expert-use functions.

4. The method according to claim 1, wherein activating the expert-use mode includes:

permitting a user to specify an output mode over acquired data is provided.

5. The method according to claim 4, wherein the output mode includes saving the acquired data to a memory card, sending the acquired data to a USB port, sending the acquired data via Bluetooth or saving the acquired data as an input to a program.

6. The method according to claim 1, wherein activating the expert-use mode includes:

sending, by the mobile device, a request for the selected expert-use function to the detection and evaluation device;

receiving, by the detection and evaluation device, the request for selected expert-use function;

executing, by the detection and evaluation device, the selected expert-use function and acquiring detection and evaluation data; and sending to the mobile device, by the detection and evaluation device, the acquired detection and evaluation data.

7. The method according to claim 6, wherein activating the expert-use mode includes:

receiving, by the mobile device, the acquired detection and evaluation data from the detection and evaluation device; and displaying, by the mobile device, the detection and evaluation data acquired regarding the expert-use function.

8. The method according to claim 1, comprising:

detecting, by the detection and evaluation device, the connection of programming connectors in the detection and evaluation device;

receiving, by the detection and evaluation device through programming connectors, instructions regarding an advanced function;

storing, by the detection and evaluation device, the advanced function;

sending, by the detection and evaluation device, advanced function information to the mobile device; and including, by the mobile device, the advanced function within a list of executable functions.

9. The method according to claim 1, wherein the processing circuit comprises a microcontroller.

10. The method according to claim 1, wherein the wireless connection of the mobile device is a Bluetooth connection.

11. A computer product for a mobile device, the computer product including programming instructions stored on a non-transitory storage medium, and which, when loaded into and executed by the mobile device, execute operations comprising:

displaying a plurality of executable functions and an expert-use function;

detecting selection of a specific function from the plurality of executable functions or selection of the expert-use function;

in response to detecting the selection of the specific function, sending a request for activation of the specific function through a wireless connection of the mobile device;

receiving, by a detection and evaluation device, a request for executing the specific function;

activating, by a processing circuit, at least one selected sensor selected from at least one inertial sensor or at least one environmental sensor;

receiving, by the processing circuit, measurement data from the at least one selected sensor;

performing, by the processing circuit, the specific function based on the measurement data received from the at least one selected sensor;

sending to the mobile device, by the detection and evaluation device, detection and evaluation data associated with the specific function, using the wireless connection;

receiving, by the mobile device, the detection and evaluation data associated with the specific function;

displaying, by the mobile device, the detection and evaluation data associated with the specific function; and in response to detecting the selection of the expert-use function, activating an expert-use mode.

12. The computer product of claim 11, wherein the computer product further includes programming instructions which, when loaded into and executed on the mobile device, execute the step of displaying, on the mobile device, a list of the at least one inertial sensor and at least one environmental sensor available in the detection and evaluation device.

13. The computer product according to claim 11, wherein activating the expert-use mode includes:

displaying, by the mobile device, a list of at least one inertial sensor and at least one environmental sensor available in the detection and evaluation device; and detecting, by the mobile device, selection of at least one of the at least one inertial sensor or at least one environmental sensor in the list;

showing, by the mobile device, a list of expert-use functions including at least one expert-use function executable by the selected sensor or detector; and detecting, by the mobile device, selection of an expert-use function from the list of expert-use functions.

14. The computer product according to claim 13, wherein activating the at least one environmental sensor is a temperature sensor or a humidity sensor.

15. The computer product according to claim 13, wherein activating the expert-use mode includes:

permitting a user to add to one or more expert-use functions to the list of expert-use functions.

16. The computer product according to claim 13, wherein activating the expert-use mode includes:

permitting a user to specify an output mode over acquired data is provided.

17. The computer product according to claim 16, wherein the output mode includes saving the acquired data to a memory card, sending the acquired data to a USB port, sending the acquired data via Bluetooth or saving the acquired data as an input to a program.

18. The computer product according to claim 13, wherein activating the expert-use mode includes:

sending, by the mobile device, a request for the selected expert-use function to the detection and evaluation device;

receiving, by the detection and evaluation device, the request for selected expert-use function;

executing, by the detection and evaluation device, the selected expert-use function and acquiring detection and evaluation data; and sending to the mobile device, by the detection and evaluation device, the acquired detection and evaluation data.

19. The computer product according to claim 18, wherein activating the expert-use mode includes:

receiving, by the mobile device, the acquired detection and evaluation data from the detection and evaluation device; and displaying, by the mobile device, the detection and evaluation data acquired regarding the expert-use function.

* * * * *